United States Patent
Park et al.

(10) Patent No.: US 9,659,965 B2
(45) Date of Patent: May 23, 2017

(54) LIQUID CRYSTAL DISPLAY DEVICE AND METHOD OF MANUFACTURING THE SAME

(71) Applicant: Samsung Display Co., Ltd., Yongin, Gyeonggi-Do (KR)

(72) Inventors: Heungshik Park, Yongin (KR); Jihong Bae, Yongin (KR); Ohjeong Kwon, Yongin (KR); Kichul Shin, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 119 days.

(21) Appl. No.: 14/656,003

(22) Filed: Mar. 12, 2015

(65) Prior Publication Data

US 2016/0077365 A1    Mar. 17, 2016

(30) Foreign Application Priority Data

Sep. 12, 2014  (KR) .................. 10-2014-0121268
Feb. 12, 2015  (KR) .................. 10-2015-0021782

(51) Int. Cl.
*G02F 1/1337* (2006.01)
*H01L 27/12* (2006.01)

(52) U.S. Cl.
CPC .... *H01L 27/1214* (2013.01); *G02F 1/133707* (2013.01); *G02F 1/133711* (2013.01);
(Continued)

(58) Field of Classification Search
CPC ... G02F 1/133711; G02F 2001/133742; G02F 2001/133726; G02F 1/13378; G02F 1/1337
See application file for complete search history.

(56) References Cited

U.S. PATENT DOCUMENTS 8,310,636 B2 * 11/2012 Terashita .......... G02F 1/133711
                                                          349/123
2005/0116200 A1   6/2005 Nakanishi et al.
(Continued)

FOREIGN PATENT DOCUMENTS

EP      1 340 118 B1    11/2001
JP      2011-505445 A    2/2011
(Continued)

OTHER PUBLICATIONS

Shug-June Hwang et al., Characteristics of nanoparticle-doped homeotropic liquid crystal devices, Journal of Physics D: Applied Physics, 2009, 42/025102, IOP Publishing, Web.
(Continued)

*Primary Examiner* — Kendrick Hsu
(74) *Attorney, Agent, or Firm* — Robert E. Bushnell, Esq.

(57) ABSTRACT

A liquid crystal display (LCD) device comprises a first substrate, a second substrate disposed to face the first substrate, a liquid crystal layer which is disposed between the first substrate and the second substrate and which includes multiple liquid crystal molecules, and a self-alignment layer formed between the first substrate and the liquid crystal layer, the self-alignment layer comprising a vertical alignment additive having a molecular structure having a hydrophilic group and a polymerized group formed in both ends of a core molecule, wherein a major axis of the vertical alignment additive is at an angle less than about 90° with respect to a surface of the first substrate.

17 Claims, 8 Drawing Sheets

(52) U.S. Cl.
CPC ...... *H01L 27/1218* (2013.01); *H01L 27/1262* (2013.01); *G02F 2001/133726* (2013.01); *G02F 2001/133742* (2013.01)

(56) References Cited

U.S. PATENT DOCUMENTS

| | | |
|---|---|---|
| 2005/0179003 A1 | 8/2005 | Heckmeier et al. |
| 2006/0127603 A1 | 6/2006 | Kim et al. |
| 2011/0037026 A1 | 2/2011 | Lee et al. |
| 2013/0182202 A1 | 7/2013 | Graziano et al. |

FOREIGN PATENT DOCUMENTS

| | | |
|---|---|---|
| KR | 10-2006-0066045 A | 6/2006 |
| KR | 10-2008-0026827 A | 3/2008 |
| KR | 10-2013-0110172 A | 10/2013 |
| WO | 2012038026 A1 | 3/2012 |

OTHER PUBLICATIONS

Shie-Chang Jeng et al. Nanoparticles-induced vertical alignment in liquid crystal cell, Applied Physics Letters, 2007, 91.061112, American Institute of Physics, Web.

* cited by examiner

LIQUID CRYSTAL DISPLAY DEVICE AND METHOD OF MANUFACTURING THE SAME

CLAIM OF PRIORITY

This application claims the benefit of Korean Patent Applications No. 10-2014-0121268, filed on Sep. 12, 2014 and No. 10-2015-0021782, filed on Feb. 12, 2015, in the Korean Intellectual Property Office, and all the benefits accruing therefrom under 35 U.S.C. §119, the disclosure of which is incorporated herein in its entirety by reference.

BACKGROUND OF THE INVENTION

Field of the Invention

The present invention relates to a liquid crystal display (LCD) device and a method of manufacturing the same.

Description of the Related Art

Liquid crystal display (LCD) devices are one type of flat panel display devices which are currently widely being used. The LCD devices include two substrates having formed thereon field-generating electrodes such as pixel electrodes, common electrodes and the like, and a liquid crystal layer interposed between the two substrates. The LCD devices display images by applying a voltage to the field-generating electrodes to generate an electric field on the liquid crystal layer, determining a direction in which the liquid crystal molecules of the liquid crystal layer are aligned by using the electric field, and controlling polarization of incident light.

The LCD devices may be classified into vertically aligned mode LCD devices which drive liquid crystals by using an electric field formed in a direction perpendicular to a substrate and in-plane switching mode LCD devices which use a horizontal electric field formed in parallel with the substrate.

The vertically aligned mode LCD devices have superior contrast ratio compared to in-plane switching mode LCD devices. In order to ensure a wide viewing angle and increase an aperture ratio of these vertically aligned mode LCD devices, a liquid crystal layer region corresponding to one pixel is divided into a plurality of domains, and liquid crystal molecules having different pretilt angles exist inside of each of the domains.

Recently, the demand for curved display devices has been increasing. During bending processing, the degree of bending of an upper substrate and the degree of bending of a lower substrate differ from each other such that, in one domain of liquid crystal layer region, pretilt angles of liquid crystal molecules in an upper portion of the domain differ from those of liquid crystal molecules in a lower portion of the domain. That is, misalignment occurs. Such misalignment results in a stable texture.

Information disclosed in this Background section was already known to the inventors before achieving the present invention or is technical information acquired during the process of achieving the present invention. Therefore, it may contain information that does not form the prior art that is already known to the public in this country.

SUMMARY OF THE INVENTION

One or more exemplary embodiments of the present invention include a liquid crystal display (LCD) device capable of reducing generation of texture caused by misalignment when being applied as a curved panel.

Additional aspects will be set forth in part in the description which follows and, in part, will be apparent from the description, or may be learned by practice of the presented embodiments.

According to one or more exemplary embodiments, a liquid crystal display (LCD) device includes a first substrate, a second substrate disposed to face the first substrate, a liquid crystal layer which is disposed between the first substrate and the second substrate and which includes multiple liquid crystal molecules, and a self-alignment layer formed between the first substrate and the liquid crystal layer, the self-alignment layer comprising a vertical alignment additive having a molecular structure having a hydrophilic group formed in an end of a core molecule, wherein the hydrophilic group faces a surface of the first substrate and a major axis of the core molecule is at an angle less than about 90° with respect to the surface of the first substrate.

A polymerized group may be further formed in the other end of the core molecule.

The core molecule may be formed of biphenyl of a mesogenic unit, a plurality of benzenes, or a cyclohexane ring.

An alignment layer may be formed between the second substrate and the liquid crystal layer.

A difference between an angle between a major axis of liquid crystal molecules contacting the self-alignment layer and the surface of the first substrate and an angle between a major axis of liquid crystal molecules contacting the alignment layer and a surface of the second substrate may be greater than about 0.5°.

An angle between a major axis of liquid crystal molecules contacting the self-alignment layer and the surface of the first substrate may be greater than about 85° and less than about 89.5°.

The surface of the first substrate contacting the self-alignment layer may be in a hydrophilic-treated state.

A nitride silicon layer may be further formed between the first substrate and the self-alignment layer.

A color filter may be formed on one of the first substrate and the second substrate, and a thin film transistor (TFT) array layer may be formed on the other of the first substrate and the second substrate.

A color filter and a TFT array layer may be formed on one of the first substrate and the second substrate.

The first substrate and the second substrate may be bent to form a curved display surface.

According to one or more exemplary embodiments, a method of manufacturing a liquid crystal display (LCD) device includes providing a first substrate and a second substrate on which a pixel electrode and a common electrode are respectively formed, forming a liquid crystal mixture by mixing multiple liquid crystal molecules with an additive formed of multiple molecules having a hydrophilic group formed in an end of a core molecule, hydrophilic-treating one of the first substrate and the second substrate, and disposing the liquid crystal mixture between the first substrate and the second substrate and performing field exposure.

A polymerized group may be further formed in the other end of the core molecule.

An amount of the additive included in the liquid crystal mixture may be about 0.001% to about 0.5%.

The liquid crystal mixture may further include alkenyl single or alkoxy single.

In the hydrophilic-treating of one of the first substrate and the second substrate, a contact angle of one of the first substrate and the second substrate with respect to distilled water may be less than about 70°.

The hydrophilic-treating of one of the first substrate and the second substrate may include forming a hydrophilic layer on one of the first substrate and the second substrate.

The method may further include performing heat processing or ultraviolet (UV) emission processing on one of the first substrate and the second substrate.

The provision of the first substrate and the second substrate may include forming a color filter on the first substrate and forming a thin film transistor (TFT) array layer on the second substrate.

The provision of the first substrate and the second substrate may include forming a thin film transistor (TFT) array layer and a color filter on the second substrate.

The method may further include bending the first substrate and the second substrate to form a curved display surface.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
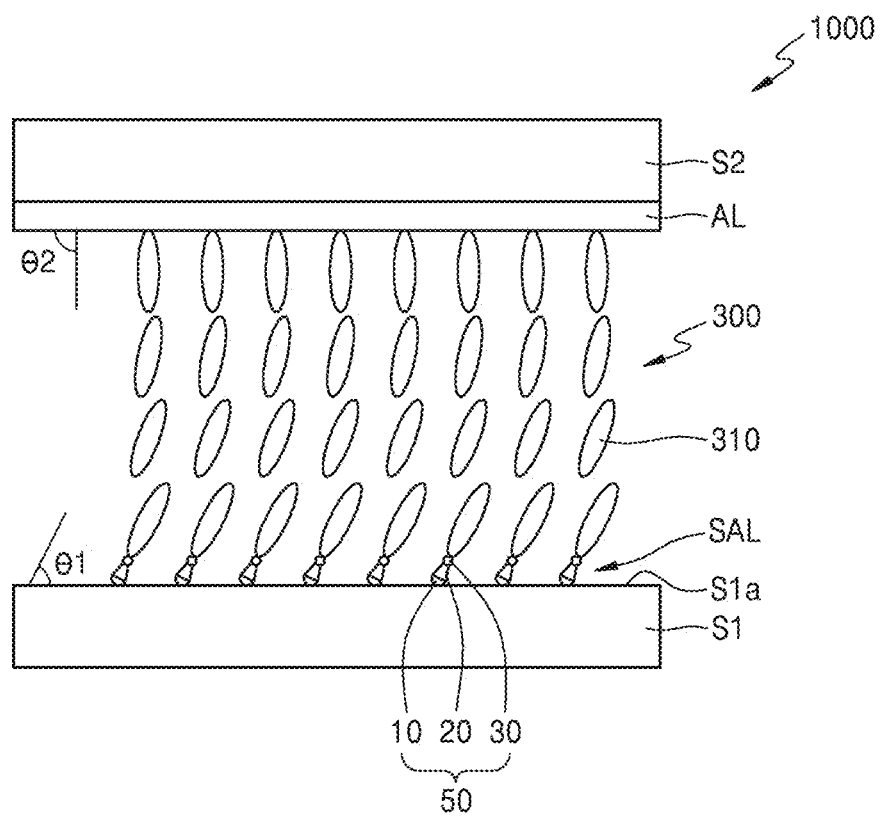
FIG. 1 is a cross-sectional view schematically illustrating a liquid crystal display (LCD) device according to an embodiment of the present invention.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items.

In the following embodiments, terms such as "first", "second", and so forth are used only for distinguishing one component from another component, rather than for restrictive meanings.

In the following embodiments, the singular forms are intended to include the plural forms as well unless the context clearly indicates otherwise.

In the following embodiments, the terms "comprises" and/or "has", when used in this specification, specify the presence of stated feature, number, step, operation, component, element, or a combination thereof, but do not preclude the presence or addition of one or more other features, numbers, steps, operations, components, elements, or combinations thereof.

In the following description, when a layer, region, or component is referred to as being "above" or "on" another layer, region, or component, it can be directly or indirectly on the other layer, region, or component.

Sizes of elements in the drawings may be exaggerated or reduced for convenience of explanation. In other words, since sizes and thicknesses of components in the drawings are arbitrarily illustrated for convenience of explanation, the following embodiments are not limited thereto.

FIG. 1 is a cross-sectional view schematically illustrating a liquid crystal display (LCD) device according to an embodiment of the present invention.

The LCD device 1000 may include a first substrate S1, a second substrate S2 disposed to face the first substrate S1, and a liquid crystal layer 300 disposed between the first substrate S1 and the second substrate S2 and formed of multiple liquid crystal molecules 310.

A self-alignment layer SAL is formed between the first substrate S1 and the liquid crystal layer 300. The self-alignment layer SAL is provided to form a predetermined pretilt angle to the liquid crystal molecules 310. That is, the major axis of the liquid crystal molecules 310 disposed in contact with the self-alignment layer SAL forms an angle θ1, which is less than 90°, with respect to the surface of the first substrate S1. For example, the angle θ1 may be greater than 85° and less than 89.5°.

The self-alignment layer SAL includes a vertical alignment additive 50 having a molecular structure in which a hydrophilic group 10 is formed in an end of a core molecule 20. A polymerized group 30 may be further formed in the other end of the core molecule 30. Although the hydrophilic group 10 and the polymerized group 30 are illustrated as being respectively formed in both ends of the core molecule 30, the structure is not limited to the illustration and the polymerized group 30 may be omitted. The hydrophilic group 10 is self-aligned toward the surface of the first substrate S1, and the major axis of the vertical alignment additives 50 is at an angle less than 90° with respect to the surface of the first substrate S1, such that the liquid crystal molecules 310 contacting the self-alignment layer SAL are aligned in the same direction.

The molecular structure of the vertical alignment additives 50 forming the self-alignment layer SAL is highly similar to that of the liquid crystal molecules 310. For example, the core molecule 20 may be formed of biphenyl of a mesogenic unit, a plurality of benzenes, or a cyclohexane ring.

The hydrophilic group 10 may include a hydroxyl group (—OH), an amino group (—NH2), or a ketone group (C=O). The hydrophilic group 10 may a polar group having a polar structure component having an atom selected from N, O, S, and P.

The polymerized group 30 may include, for example, acrylate, methacrylate, fluoroacrylate, oxetane, vinyl oxy, or an epoxide group.

An alignment layer AL may be formed between the second substrate S2 and the liquid crystal layer 300. The alignment layer AL is formed of a vertically-aligned material to vertically align the liquid crystal molecules 310 of the liquid crystal layer 300 contacting the alignment layer AL. The major axis of the liquid crystal molecules 310 of the liquid crystal layer 300 contacting the alignment layer AL may form an angle $\theta 2$ of about 90° with respect to the surface of the second substrate S2.

The alignment layer AL may be formed of a general vertically-aligned material and various types of organic alignment agents or inorganic alignment agents. Examples of the organic alignment agents may include polyimide, lecithin, trichloro silane, trimethoxypropyl silane, hexadecyl trimethyl ammonium halides, and alkyl carboxylato monochromium salts. Examples of the inorganic alignment agents may include $SiO_2$, $MgF_2$, and the like.

The liquid crystal layer 300 is formed of the multiple liquid crystal molecules 310, the major axis of which is aligned vertically with respect to an electric field when the electric field is formed in the liquid crystal layer 300. That is, the liquid crystal molecules 310 may have negative-dielectric anisotropy. When the electric field is not formed in the liquid crystal layer 300, the liquid crystal molecules 310 are aligned generally vertically with respect to the surface of the first substrate S1 and the surface of the second substrate S2, and have a pretilt angle determined by the self-alignment layer SAL and the alignment layer AL. In the current embodiment, the self-alignment layer SAL and the alignment layer AL are formed such that a pretilt angle is formed on a lower portion of the liquid crystal layer 300 and a pretilt angle is not formed on an upper portion of the liquid crystal layer 300. The liquid crystal molecules 310 of the liquid crystal layer 300, which contact the self-alignment layer SAL, have a pretilt angle of about 0.5° or more, and the liquid crystal molecules 310 of the liquid crystal layer 300, which contact the alignment layer AL, are aligned almost vertically with respect to the surface of the second substrate S2 without forming a pretilt angle. A difference between the angle $\theta 1$ formed between the major axis of the liquid crystal molecules 310 contacting the self-alignment layer SAL and the surface of the first substrate S1 and the angle $\theta 2$ formed between the major axis of the liquid crystal molecules 310 contacting the alignment layer AL and the surface of the second substrate S2 may be greater than 0.5° and less than 15°.

By determining pretilt angle distribution in the above-described manner, texture caused by misalignment occurring in bending processing may be reduced when the LCD device 1000 is applied as a curved panel.

Figure 2:
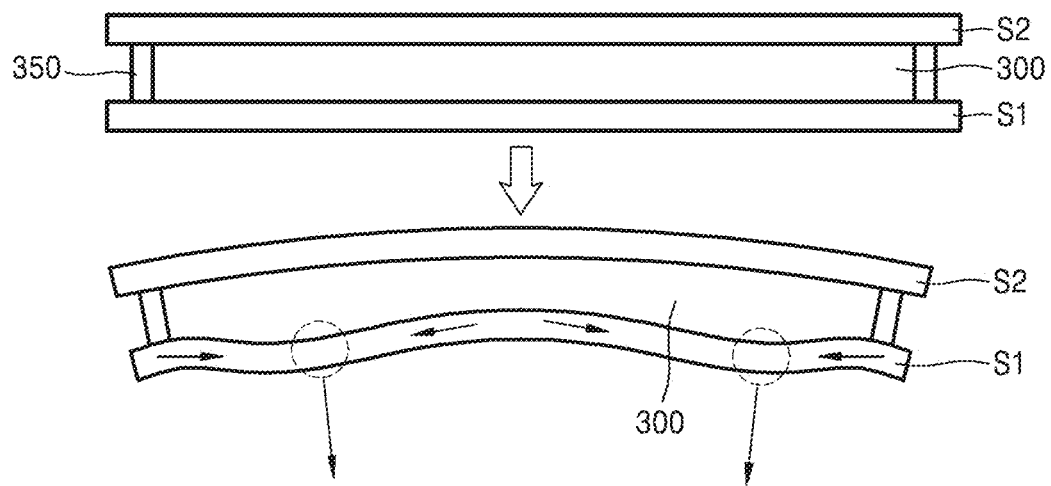
FIG. 2 is a conceptual view showing that the degree of bending of an upper substrate and the degree of bending of a lower substrate are different from each other in bending processing for forming a curved panel.

FIG. 2 is a conceptual diagram showing that the degree of bending of an upper substrate and the degree of bending of a lower substrate are different from each other in bending processing for forming a curved panel.

Referring to FIG. 2, an edge of a panel is fixed with a sealant 350, such that buckling occurs in a dotted portion, and misalignment occurs between the upper substrate and the lower substrate in a direction toward the outside from the center of the panel. Thus, misaligned texture is generated in which transmissivity may be reduced.

Figure 3A:
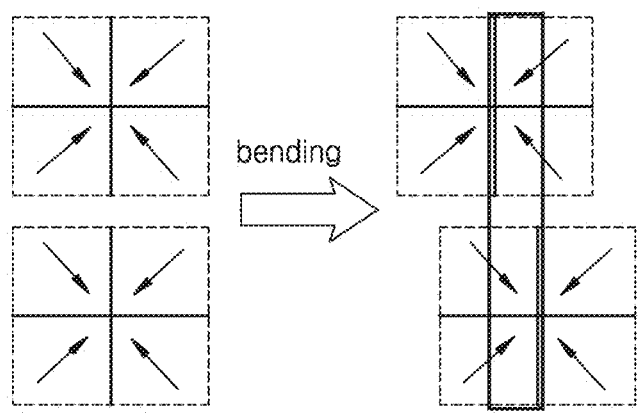
FIGS. 3A and 3B conceptually show domain misalignment occurring due to bending of a substrate according to a comparative example and an embodiment.
Figure 3B:
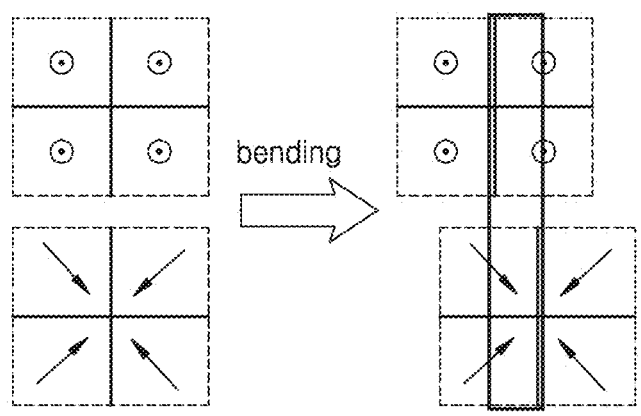

FIGS. 3A and 3B conceptually show domain misalignment occurring due to bending of a substrate according to a comparative example and an embodiment.

FIG. 3A shows an LCD device according to a comparative example in which the same pretilt angle is applied on an upper portion and a lower portion of a liquid crystal layer, and FIG. 3B shows an LCD according to an embodiment in which a pretilt angle is applied only on the lower portion of the liquid crystal layer. In FIGS. 3A and 3B, an arrow indicates a major-axis direction of liquid crystal molecules.

In each of FIGS. 3A and 3B, left upper and lower sides show states before bending, and are planar views showing directions of liquid crystal molecules on the upper portion and the lower portion of a region where buckling occurs due to bending as shown in FIG. 2.

In each of FIGS. 3A and 3B, right upper and lower sides show states after bending, and are planar views showing directions of liquid crystal molecules on the upper portion and the lower portion of a region where buckling occurs due to bending as shown in FIG. 2. Rectangles expressed with solid lines indicate facing regions.

As shown in FIG. 3A, in the comparative example, pretilt angles of the facing regions do not meet due to bending, resulting in generation of texture and reduction of transmissivity. However, as shown in FIG. 3B, in the embodiment of the present invention, the pretilt angle is applied only on the lower portion of the liquid crystal layer such that, in spite of misalignment caused by buckling, generation of texture or reduction of transmissivity may not be significant.

For the embodiment, the inventor analyzed an influence of bending by using computer simulation while changing the pretilt angles $\theta 1$ and $\theta 2$ on the upper portion and the lower portion of the liquid crystal layer, and the analysis results are shown in Table 1.

TABLE 1

| Pretilt Angle (°) | | | Transmissivity (a.u.) | | Luminance |
|---|---|---|---|---|---|
| $\theta 1$ | $\Theta 2$ | delta | alignment | 30 μm M/A | Change |
| 1 | 0 | 1 | 0.17072 | 0.17072 | 0.00% |
| 1 | 0.2 | 0.8 | 0.17191 | 0.16988 | −1.20% |
| 1 | 0.5 | 0.5 | 0.17339 | 0.16651 | −4.00% |
| 1 | 0.8 | 0.2 | 0.17459 | 0.1625 | −6.90% |
| 1 | 1 | 0 | 0.17527 | 0.15955 | −9.00% |

In Table 1, delta represents a pretilt angle difference, and M/A represents misalignment.

Referring to Table 1, as the pretilt angle difference increases, a luminance reduction resulting from misalignment is small. Thus, by setting the pretilt angle difference to a proper value greater than 0.8°, a luminance change may become about 1%.

Although it is illustrated in FIG. 1 that the upper portion of the liquid crystal layer has no pretilt angle and the lower portion of the liquid crystal layer has a pretilt angle of 0.5° or more, this is merely exemplary. The lower portion of the liquid crystal layer may have no pretilt angle and the upper portion of the liquid crystal layer may have a pretilt angle of 0.5° or more.

Hereinafter, detailed structures of an LCD device according to various embodiments to which the above-described concept is applied will be described.

Figure 4:
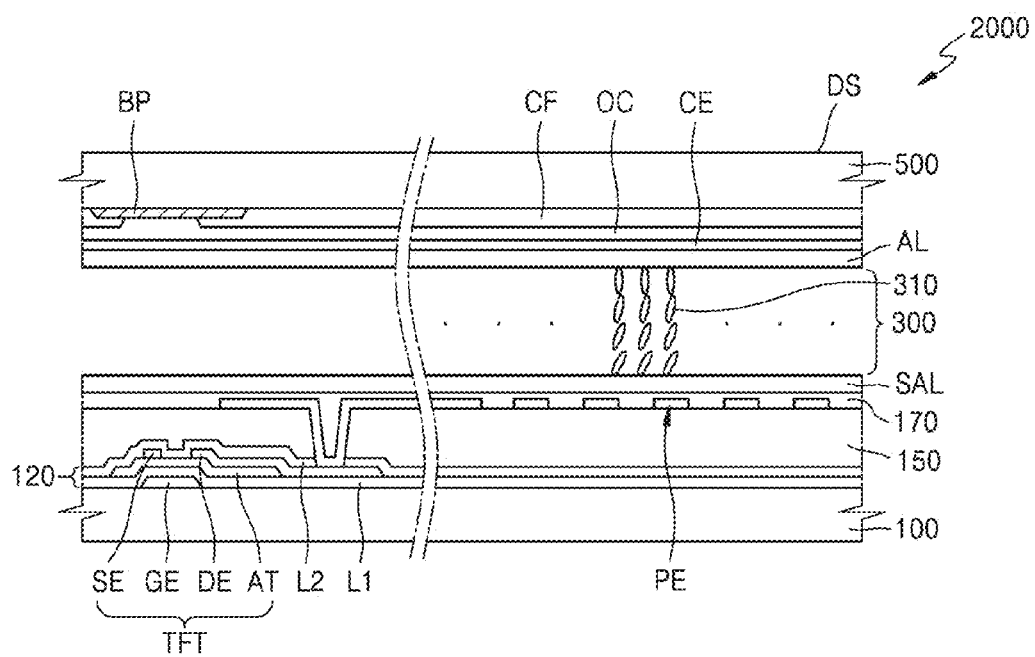
FIG. 4 is a cross-sectional view schematically illustrating an LCD device according to another embodiment of the present invention.
Figure 5:
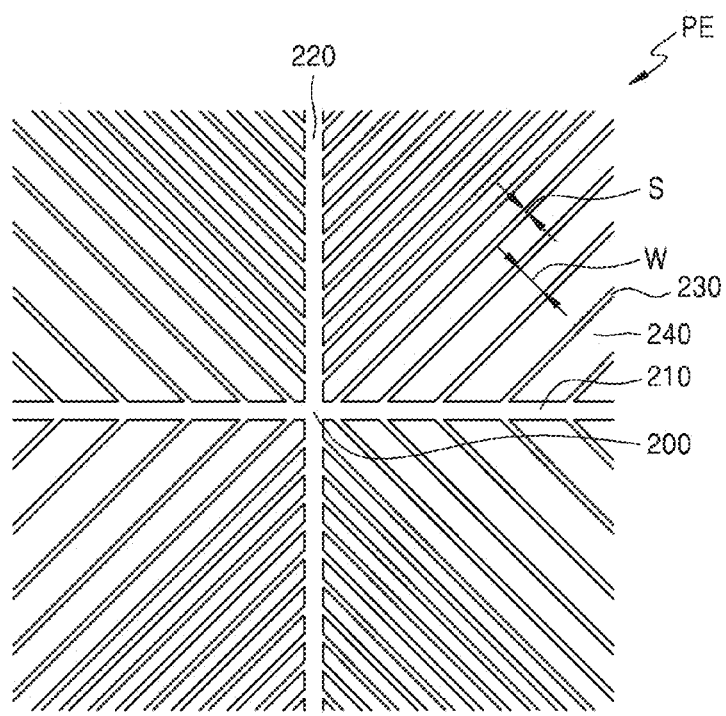
FIG. 5 is a planar view illustrating an exemplary shape of a pixel electrode adopted in an LCD device of FIG. 4.

FIG. 4 is a cross-sectional view schematically illustrating an LCD device according to another embodiment of the present invention, and FIG. 5 is a planar view illustrating an exemplary shape of a pixel electrode adopted in an LCD device of FIG. 4.

Referring to FIG. 4, the LCD device 2000 may include a first substrate 100, a second substrate 500, and a liquid crystal layer 300. The liquid crystal layer 300 may include multiple liquid crystal molecules having negative-dielectric anisotropy, in which liquid crystal molecules 310 in a lower portion, that is, a portion that is adjacent to the first substrate 100, have a predetermined pretilt angle of about 0.5°-15°, and liquid crystal molecules 310 in an upper portion, that is, a portion that is adjacent to the second substrate 500, are aligned almost vertically with respect to the surface of the second substrate 500 without a pretilt angle. To form a pretilt angle, the self-alignment layer SAL having the structure illustrated in FIG. 1 is formed on the first substrate 100 and the alignment layer AL having a vertically-aligned material is formed on the second substrate 500.

A thin film transistor (TFT) array layer 120 and a pixel electrode PE are formed on the first substrate 100. The TFT array layer 120 includes a plurality of switching elements TFT, and a plurality of gate lines and a plurality of data lines that are not shown.

The first substrate 100 may be a plastic substrate including polyethylen terephthalate (PET), polyethylen naphthalate (PEN), polyimide, and the like, as well as a glass substrate.

The switching elements TFT are thin film transistors and include an active layer AT, a gate electrode GE, a source electrode SE, and a drain electrode DE.

A first insulating layer L1, which is a gate insulating layer, is formed on the gate electrode GE, and the active layer AT is formed on the first insulating layer L1. On the active layer AT, the drain electrode DE and the source electrode SE are formed spaced apart from each other and a second insulating layer L2 is formed to cover the drain electrode DE and the source electrode SE.

The active layer AT may be formed to include various materials. For example, the active layer AT may include an inorganic semiconductor material such as amorphous silicon or crystalline silicon. As another embodiment, the active layer AT may include oxide semiconductor. As another embodiment, the active layer AT may include an organic semiconductor material.

The gate electrode GE, the source electrode SE, and the drain electrode DE may be formed as a single layer or a plurality of layers formed of one or more metals selected from among aluminum (Al), white gold (Pt), palladium (Pd), silver (Ag), magnesium (Mg), gold (Au), nickel (Ni), neodymium (Nd), iridium (Ir), chrome (Cr), nickel (Ni), calcium (Ca), molybdenum (Mo), titanium (Ti), tungsten (W), and copper (Cu).

The first insulating layer L1 and the second insulating layer L2 may be formed of various types of insulating materials. The first insulating layer L1 and the second insulating layer L2 may be formed as a single layer or a plurality of layers formed of one or more insulating layers selected from among $SiO_2$, $SiNx$, $SiON$, $Al_2O_3$, $TiO_2$, $Ta_2O_5$, $HfO_2$, $ZrO_2$, BST, and PZT.

A planarization layer 150 may be further provided on the TFT array layer 120.

The pixel electrode PE is provided on the planarization layer 150, and is connected with the drain electrode DE of the switching element TFT through the planarization layer 150 and the second insulating layer L2.

The self-alignment layer SAL for forming a pretilt angle of the liquid crystal molecules 310 is further formed on the pixel electrode PE. A hydrophilic layer 170 may be further provided between the pixel electrode PE and the self-alignment layer SAL. The hydrophilic layer 170 is provided to provide a hydrophilic surface for forming the self-alignment layer SAL. The hydrophilic layer 170 may be formed of a nitride silicon layer or an oxide silicon layer, or may be formed as a plurality of layers including a nitride silicon layer and an oxide silicon layer. The hydrophilic layer 170 is a selective layer and may be omitted by performing hydrophilic treatment with respect to the surface of the pixel electrode PE and the surface of the planarization layer 150.

A light-shielding pattern BP, a color filter CF, an over-coating layer OC, and a common electrode CE are formed on the second substrate 500, and the alignment layer AL formed of a vertically-aligned material is formed on the common electrode CE. The second substrate 500 may be a glass substrate or a transparent plastic substrate, and the outer surface of the second substrate 500 is a display surface DS.

The light-blocking pattern BP is disposed on the second substrate 500 in a position corresponding to a region where the switching element TFT, the gate line (not shown), and the data lines are formed, and blocks light. The position where the light-blocking pattern BP is disposed is exemplary, and it may be disposed on the first substrate 100.

The color filter CF is disposed on the second substrate 500, and filters color light. The position of the color filter CF is exemplary, and it may be disposed on the first substrate 500.

The over-coating layer OC is disposed on the second substrate 500 on which the color filter CF is formed so as to planarize the top surface of the second substrate 500. The over-coating layer OC may be omitted.

The common electrode CE is disposed on the second substrate 500 so as to face the pixel electrode PE, and a reference voltage, that is, a common voltage for defining the polarity of a voltage applied to the pixel electrode PE, is applied to the common electrode CE. The common electrode CE may have a flat-panel form.

The pixel electrode PE may have a form as illustrated in FIG. 5.

Referring to FIG. 5, the pixel electrode PE has a cross-shape stem portion 200 including a horizontal stem portion 210 and a vertical stem portion 220. A plurality of fine branch electrodes 230 extend in an inclined manner from the horizontal stem portion 210 and the vertical stem portion 220. A pixel region is divided into four domains by the cross-shape stem portion 200.

Although the fine branch electrode 230 is illustrated to have a linear shape, it may also have a zigzag shape. A width S of the fine branch electrode 230 and a width W of a fine slit 240 between the fine branch electrodes 230 are illustrated as constant, but they may be changed and may also be properly designed considering liquid crystal control, texture reduction, or the like.

In an initial alignment state where a voltage is not applied between the common electrode CE and the pixel electrode PE of FIG. 4, the liquid crystal molecules 310 of the liquid crystal layer 300 form a pretilt angle of 0.5° or more in a position adjacent to the self-alignment layer SAL, and do not form a pretilt angle in a position adjacent to the alignment layer AL. This structure reduces texture generation and transmissivity reduction corresponding to bending of a substrate in application as a curved panel.

Figure 6:
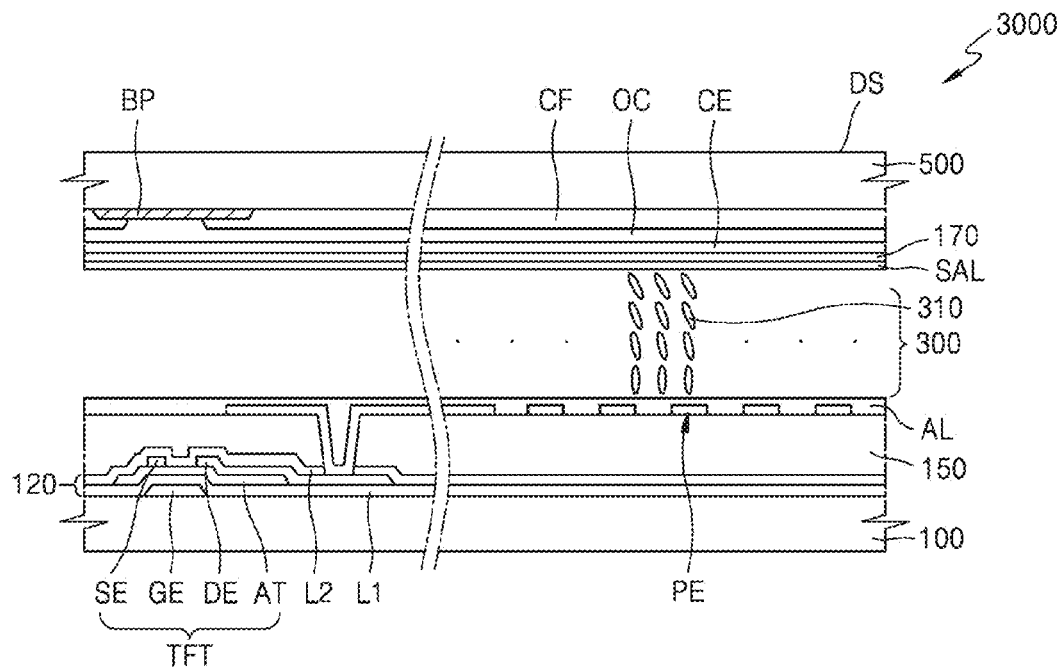
FIG. 6 is a cross-sectional view schematically illustrating an LCD device according to another embodiment of the present invention.

FIG. 6 is a cross-sectional view schematically illustrating an LCD device according to another embodiment of the present invention.

The LCD device 3000 according to the current embodiment differs from the embodiment illustrated in FIG. 4 with respect to the position of the self-alignment layer SAL and the position of the alignment layer AL. The self-alignment layer SAL for forming a predetermined pretilt angle is formed on the second substrate 500, and the self-alignment layer SAL for vertical alignment is formed on the first substrate 100. The hydrophilic layer 170 is formed between the common electrode CE and the alignment layer AL, but this structure is exemplary, such that the hydrophilic layer 170 may be omitted by hydrophilic treatment with respect to the surface of the common electrode CE. According to the positions of the self-alignment layer SAL and the alignment layer AL, the upper portion of the liquid crystal layer 300 is aligned so as to have a predetermined pretilt angle and the lower portion of the liquid crystal layer 300 is aligned almost vertically.

Figure 7:
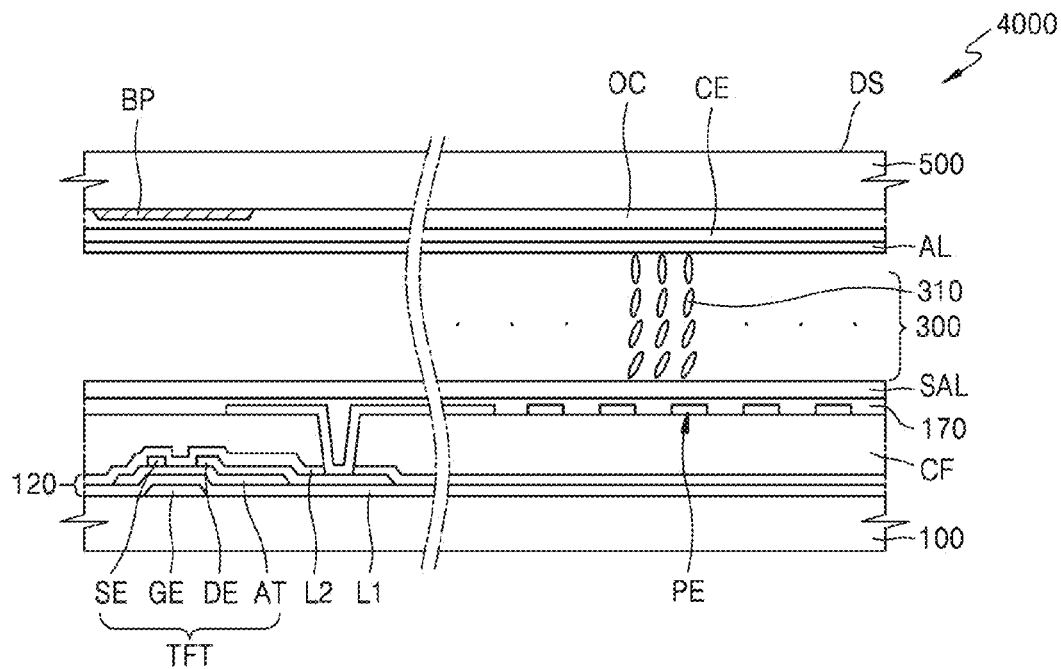
FIG. 7 is a cross-sectional view schematically illustrating an LCD device according to another embodiment of the present invention.

FIG. 7 is a cross-sectional view schematically illustrating an LCD device according to another embodiment of the present invention.

The LCD device 4000 according to the current embodiment differs from the LCD device 2000 illustrated in FIG. 4 with respect to the position of the color filter CF.

The color filter CF is formed on the first substrate 100. This structure considers that much deformation by bending occurs on a substrate on which the display surface DS is formed, that is, the second substrate 500 in application as a curved panel. By disposing the color filter CF on the first substrate 100 which is deformed relatively less, occurrence of an error due to bending may be reduced.

Figure 8:
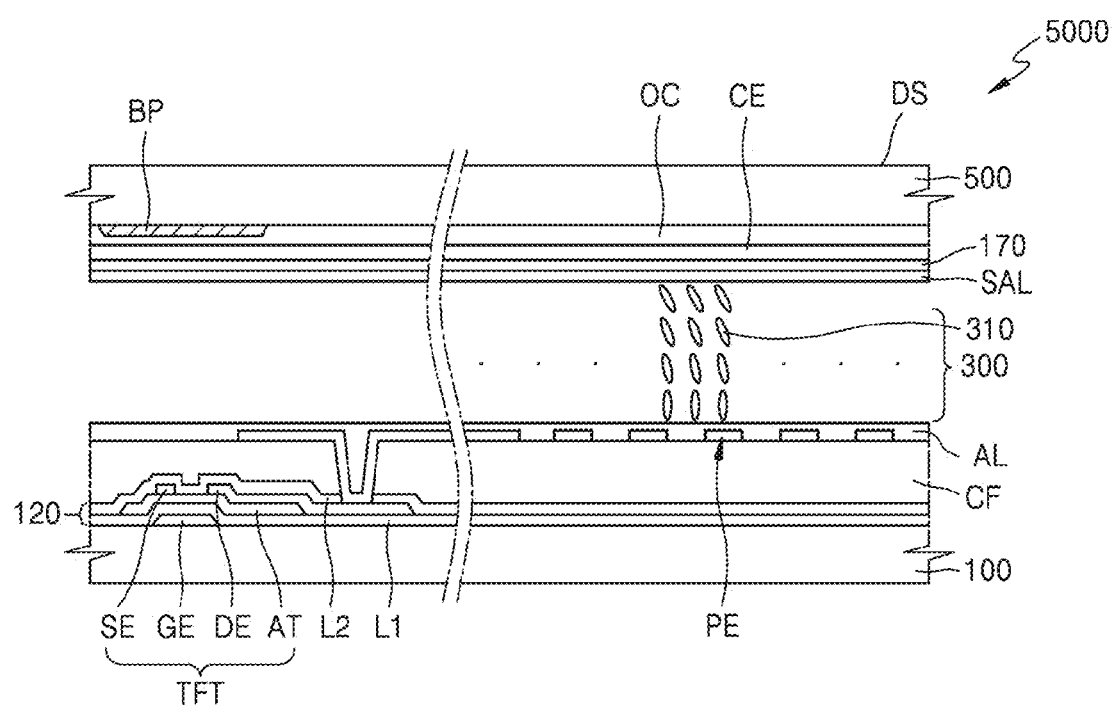
FIG. 8 is a cross-sectional view schematically illustrating an LCD device according to another embodiment of the present invention.

FIG. 8 is a cross-sectional view schematically illustrating an LCD device according to another embodiment of the present invention.

The LCD device 5000 according to the current embodiment differs from the embodiment illustrated in FIG. 7 with respect to the positions of the self-alignment layer SAL and the alignment layer AL. The self-alignment layer SAL for forming a predetermined pretilt angle is formed on the second substrate 500, and the self-alignment layer SAL for vertical alignment is formed on the first substrate 100. The hydrophilic layer 170 is formed between the common electrode CE and the alignment layer AL but this structure is exemplary such that, by performing hydrophilic treatment with respect to the surface of the common electrode CE, the hydrophilic layer 170 may be omitted, According to the positions of the self-alignment layer SAL and the alignment layer AL, the upper portion of the liquid crystal layer 300 is aligned to have a predetermined pretilt angle and the lower portion of the liquid crystal layer 300 is aligned almost vertically.

Figure 9:
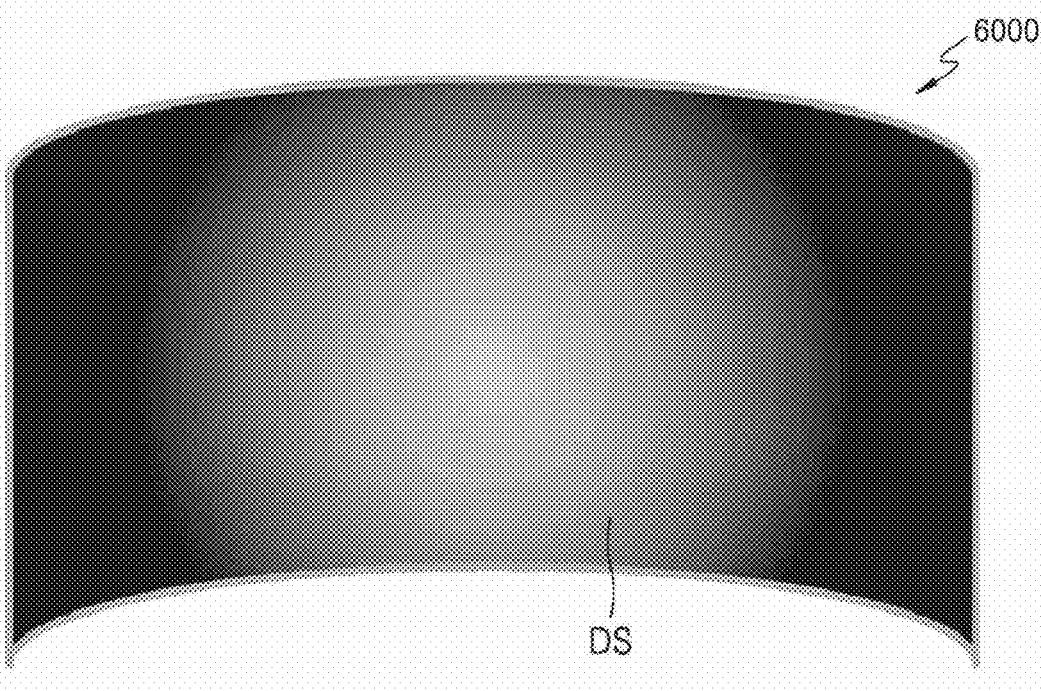
FIG. 9 is a perspective view illustrating an exterior of an LCD device according to another embodiment of the present invention.

FIG. 9 is a perspective view illustrating an exterior of an LCD device according to another embodiment of the present invention.

The LCD device 6000 according to the current embodiment has a structure bent to form the curved display surface DS. The LCD devices 2000, 3000, 4000, and 5000 of FIGS. 4, 6, 7 and 8, respectively, may be applied as curved panels.

Figure 10:
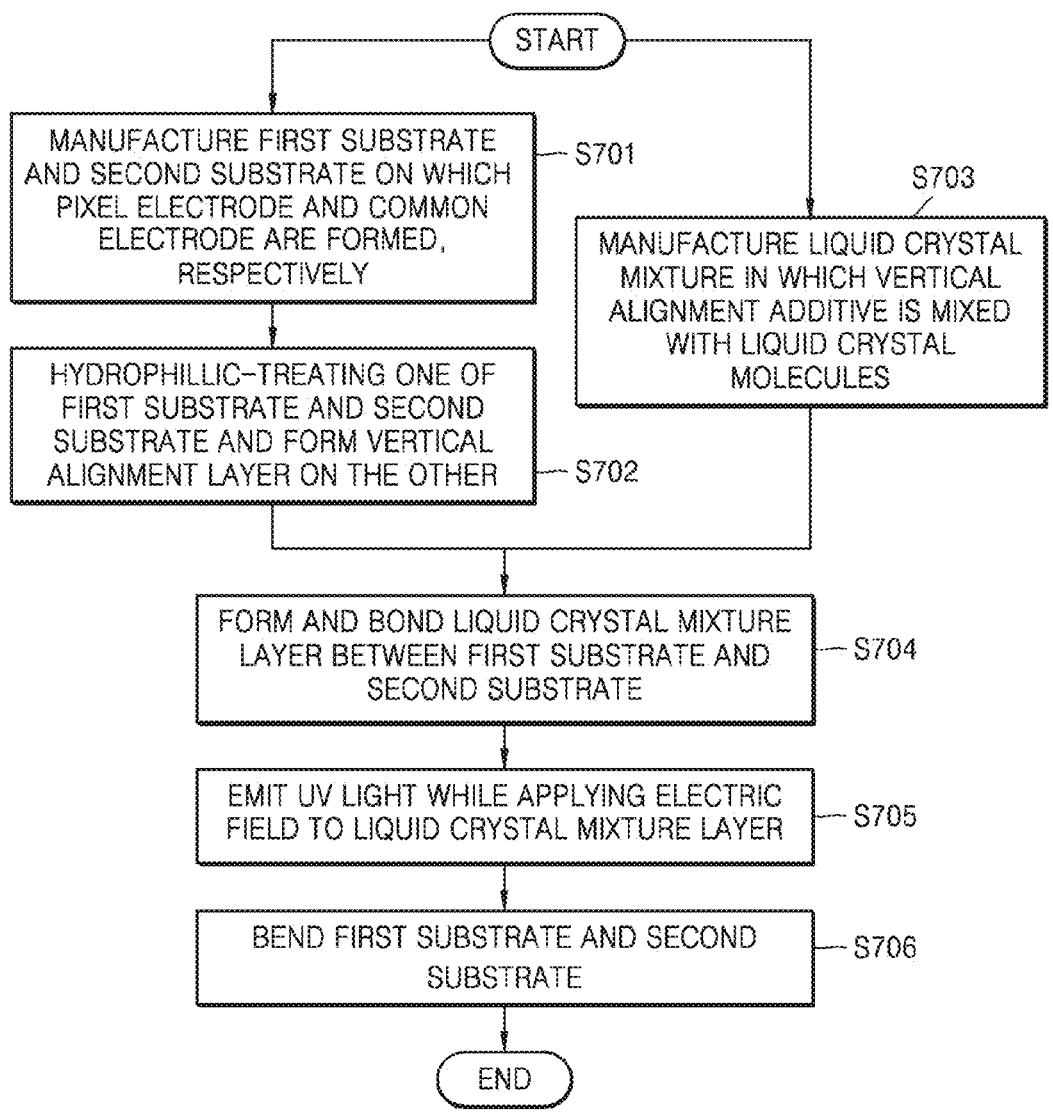
FIG. 10 is a flowchart illustrating a method of manufacturing an LCD device according to an embodiment of the present invention.
Figure 11A:
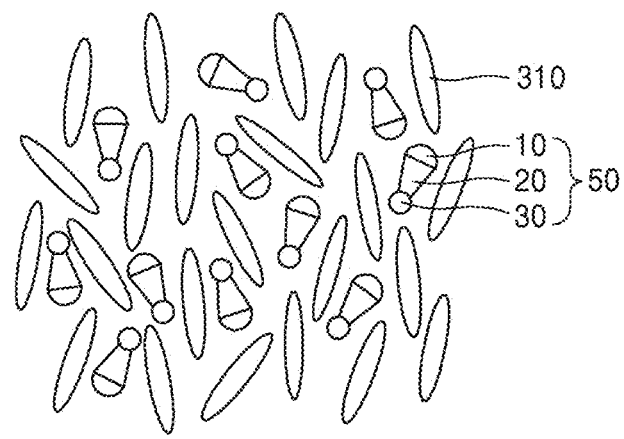
FIGS. 11A through 11C show formation of an alignment layer from a liquid crystal mixture of liquid crystal molecules and a vertical alignment additive.
Figure 11B:
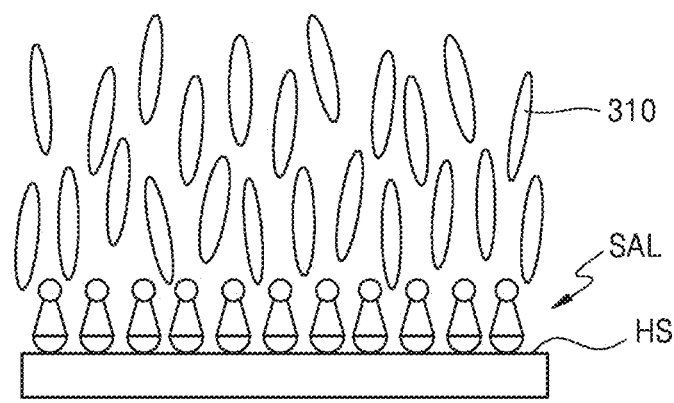
Figure 11C:
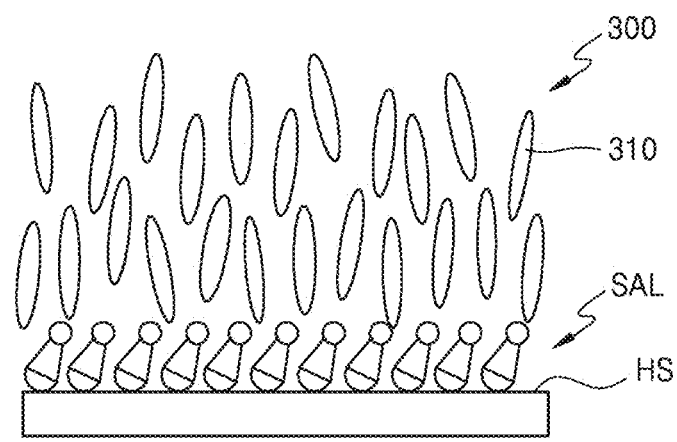

FIG. 10 is a flowchart illustrating a method of manufacturing an LCD device according to an embodiment of the present invention, and FIGS. 11A through 11c show formation of an alignment layer from a liquid crystal mixture of liquid crystal molecules and a vertical alignment additive.

Referring to FIG. 10, a first substrate and a second substrate in which a common electrode and a pixel electrode are respectively formed are provided in operation S701, and hydrophilic treatment is performed with respect to one of the first substrate and the second substrate and a vertically-aligned layer is formed on the other in operation S702. A liquid crystal mixture of liquid crystal molecules and a vertical alignment additive is made in operation S703.

Detailed elements for driving the LCD device are further formed on the first substrate and the second substrate, and have been described in the foregoing embodiments. For example, a color filter may be formed on the first substrate on which the common electrode is formed, and a TFT array layer may be formed on the second substrate on which the pixel electrode is formed, or both the TFT array layer and the color filter may be formed on the second substrate on which the pixel electrode is formed.

Hydrophilic treatment is performed with respect to one of the first substrate and the second substrate. The degree of hydrophilic property may be described as a contact angle of a liquid drop of distilled water with respect to the treated surface. A smaller contact angle means a more hydrophilic property. The degree of the hydrophilic property may be such that the contact angle is 70° or less.

For hydrophilic treatment, a hydrophilic layer may be formed on one of the substrates. The hydrophilic layer may be formed of a nitride silicon layer and/or an oxide silicon layer. The thickness of the hydrophilic layer may be about 1000 nm or less.

FIG. 11A shows a liquid crystal mixture of the liquid crystal molecules 310 and the vertical alignment additive 50. The vertical alignment additive 50 has a molecular structure in which the hydrophilic group 10 is formed in an end of the core molecule 20. The polymerized group 30 may be further formed in the other end of the core molecule 20. Although the hydrophilic group 10 and the polymerized group 30 are illustrated as being respectively formed in both ends of the core molecule 20, the polymerized group 30 may be omitted. The vertical alignment additive 50 having the above-described structure is homogeneously mixed with the liquid crystal molecules 310 without phase separation at room temperature.

The amount of the vertical alignment additive 50 included in the liquid crystal mixture may be 0.001% to 0.5%, in which % represents a weight %.

The liquid crystal mixture may further include alkenyl single or alkoxy single. The amount of the alkenyl single or the alkoxy single may be about 1% to about 70%.

The hydrophilically treated substrate may be further heated. This is because vertical alignment of the vertical alignment additive is sensitive to moisture and thus may become weak in case of exposure to high humidity. For heating, thermal treatment may be performed in a baking cell at about 120° C. for about 0.5-about 2 hours.

For the hydrophilically treated substrate, ultraviolet (UV) emission processing may be further performed in which case UV light having energy of about 50 mW or less is emitted.

The heating or UV emission processing, or both, may be omitted, or only one of them may be performed.

Once the first substrate, the second substrate, and the liquid crystal mixture are provided, the liquid crystal mixture is disposed and bonded between the first substrate and the second substrate in operation 5704 of FIG. 10.

Referring to FIG. 11B, the hydrophilic group 10 of the vertical alignment additive 50 is physically coupled to a hydrophilic surface HS by interacting with the hydrophilic surface HS, and is self-aligned. As is shown, the self-alignment layer SAL is homeotropically aligned on the hydrophilic surface HS.

Next, light is emitted to the liquid crystal mixture layer while applying an electric field to the liquid crystal mixture layer in operation 5705 of FIG. 10. To form the electric field, a voltage is applied between the common electrode and the pixel electrode formed on the second substrate and the first substrate, respectively. A detailed pattern of the pixel electrode has been designed to form a direction of the electric field suitably for a pretilt angle, such that the liquid crystal molecules 310 are aligned vertically with respect to the direction of the electric field and form a pretilt angle.

If UV light is emitted toward the liquid crystal mixture layer while maintaining this state, the polymerized group 30 of the vertical alignment additive 50 is fixed and hardened in contact with the liquid crystal molecules 310 as illustrated in FIG. 11C. Thereafter, even when the electric field is not formed, the pretilt angle is maintained.

To form a curved display surface, the first substrate and the second substrate may be further bent in operation S706 of FIG. 10.

Through the foregoing operations, an LCD device having a curved display surface, which reduces generation of texture, may be manufactured.

As described above, according to the one or more of the above exemplary embodiments, an LCD device may be provided which forms high-quality images by reducing generation of texture and improving transmissivity.

Moreover, even when the LCD device is applied as a curved panel, transmission reduction caused by substrate deformation may be reduced.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and detail may be made therein without departing from the spirit and scope as defined by the following claims.

What is claimed is:

1. A liquid crystal display (LCD) device, comprising:
   a first substrate;
   a second substrate disposed to face the first substrate;
   a liquid crystal layer which is disposed between the first substrate and the second substrate and includes multiple liquid crystal molecules; and
   a self-alignment layer formed between the first substrate and the liquid crystal layer, the self-alignment layer comprising a vertical alignment additive having a molecular structure having a hydrophilic group formed in an end of a core molecule, wherein the hydrophilic group faces a surface of the first substrate and a major axis of the core molecule is at an angle less than about 90° with respect to the surface of the first substrate.

2. The LCD device of claim 1, wherein a polymerized group is further formed in the other end of the core molecule.

3. The LCD device of claim 1, wherein the core molecule is formed of one of biphenyl of a mesogenic unit, a plurality of benzenes, and a cyclohexane ring.

4. The LCD device of claim 1, wherein an alignment layer is formed between the second substrate and the liquid crystal layer.

5. The LCD device of claim 4, wherein a difference between an angle between a major axis of liquid crystal molecules contacting the self-alignment layer and the surface of the first substrate and an angle between a major axis of liquid crystal molecules contacting the alignment layer and a surface of the second substrate is greater than about 0.5°.

6. The LCD device of claim 5, wherein a polymerized group is further formed in the other end of the core molecule.

7. The LCD device of claim 4, wherein an angle between a major axis of a liquid crystal molecules contacting the self-alignment layer and the surface of the first substrate is greater than about 85° and less than about 89.5°.

8. The LCD device of claim 1, wherein the surface of the first substrate contacts the self-alignment layer and is in a hydrophilic-treated state.

9. The LCD device of claim 1, wherein a nitride silicon layer is further formed between the first substrate and the self-alignment layer.

10. The LCD device of claim 1, wherein a color filter is formed on one of the first substrate and the second substrate, and a thin film transistor (TFT) array layer is formed on another of the first substrate and the second substrate.

11. The LCD device of claim 1, wherein a color filter and a TFT array layer are formed on one of the first substrate and the second substrate.

12. The LCD device of claim 1, wherein the first substrate and the second substrate are bent to form a curved display surface.

13. The LCD device of claim 1, further comprised of:
   a liquid crystal mixture comprised of multiple liquid crystal molecules mixed with an additive formed of multiple molecules having a hydrophilic group formed in an end of a core molecule; and
   an amount of the additive included in the liquid crystal mixture forming the liquid crystal layer is about 0.001% to about 0.5%.

14. The LCD device of claim 1, wherein the liquid crystal mixture forming the liquid crystal layer further comprises one of alkenyl single and alkoxy single.

15. The LCD device of claim 1, further comprising:
   a color filter formed on the first substrate; and
   a thin film transistor (TFT) array layer formed on the second substrate.

16. The LCD device of claim 1 further comprised of, a thin film transistor (TFT) array layer and a color filter formed on the second substrate.

17. The LCD device of claim 1, further comprised of the first substrate and the second substrate bending to form a curved display surface.

* * * * *